United States Patent

Matsuo et al.

[11] Patent Number: 6,147,302
[45] Date of Patent: Nov. 14, 2000

[54] FREQUENCY SELECTIVE ELECTROMAGNETIC WAVE SHIELDING MATERIAL AND A METHOD FOR USING THE SAME

[75] Inventors: Seiichi Matsuo; Toshiki Koso, both of Osaka; Shoichi Iida, Ikoma, all of Japan

[73] Assignee: Nippon Paint Co., Ltd., Osaka, Japan

[21] Appl. No.: 09/155,759
[22] PCT Filed: Feb. 1, 1998
[86] PCT No.: PCT/JP98/00457
    § 371 Date: Oct. 5, 1998
    § 102(e) Date: Oct. 5, 1998
[87] PCT Pub. No.: WO98/35542
    PCT Pub. Date: Aug. 13, 1998

[30] Foreign Application Priority Data

Feb. 5, 1997 [JP] Japan ............................ 22675

[51] Int. Cl.[7] .................................... H05K 9/00
[52] U.S. Cl. .................... 174/35 R; 174/35 MS; 174/52.1; 428/195; 428/441
[58] Field of Search ............... 174/35 R, 35 MS, 174/52.1; 454/276; 428/195, 441

[56] References Cited

U.S. PATENT DOCUMENTS

| | | | |
|---|---|---|---|
| 3,253,082 | 5/1966 | Beset | 174/35 |
| 3,821,463 | 6/1974 | Bakker | 174/35 MS |
| 5,239,125 | 8/1993 | Savage et al. | 174/35 MS |
| 5,895,885 | 4/1999 | Kunkel | 174/35 MS |

*Primary Examiner*—William A. Cuchlinski, Jr.
*Assistant Examiner*—Ronnie Mancho
*Attorney, Agent, or Firm*—Wenderoth, Lind & Ponack, L.L.P.

[57] ABSTRACT

A frequency-selective electromagnetic wave shielding material is used for shielding areas or devices from electromagnetic waves. The electromagnetic wave shielding material has a substrate with a plurality of electroconductive loop parts which are spatially allocated on the substrate, wherein each of the electroconductive loop parts is insulated from all other electroconductive loop parts.

21 Claims, 7 Drawing Sheets

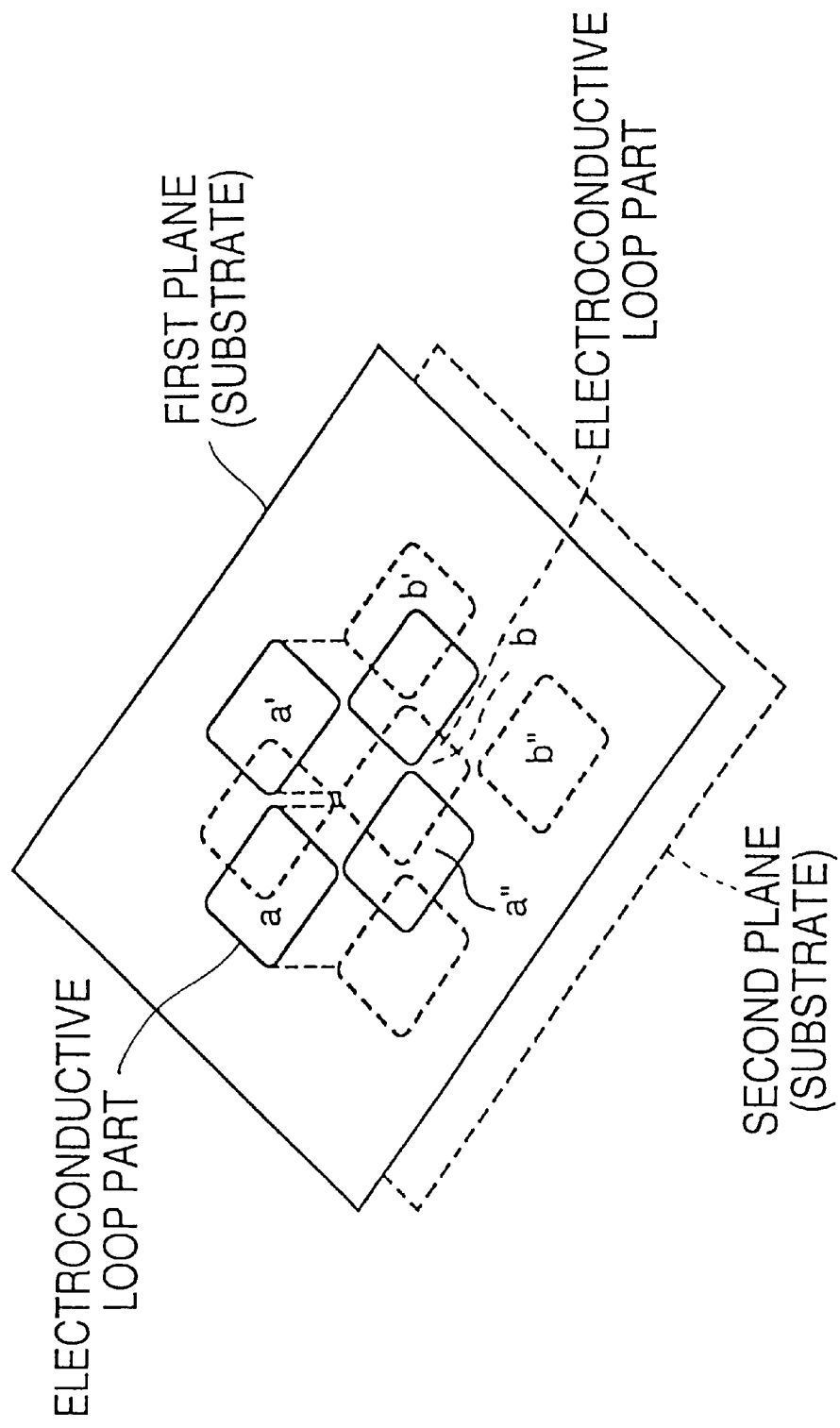

SAMPLE FIXING FRAME 3

GUIDE HORN ANTENNA 1

GUIDE HORN ANTENNA 2

SAMPLE FIXING FRAME 3

ELECTROMAGNETIC WAVE SHIELDING MATERIAL 4

FREQUENCY SELECTIVE ELECTROMAGNETIC WAVE SHIELDING MATERIAL AND A METHOD FOR USING THE SAME

TECHNICAL FIELD

The present invention relates to a novel electroconductive pattern, and more specifically to a novel electroconductive loop pattern which shields electromagnetic waves of a specific frequency range. The present invention also relates to a frequency-selective electromagnetic wave shielding material comprising the electroconductive loop pattern.

TECHNICAL FIELD

In recent years, it has become necessary to protect information of an office, or to prevent mixing, of communication lines, due to the progress of the communication systems such as portable telephone, radio LAN, and the like. Buildings are, therefore, usually surrounded with a grounded electroconductive material, and isolated from electromagnetic waves generated inside and outside the buildings.

Conventional electromagnetic wave shielding materials reflect electromagnetic waves across all frequency ranges. Therefore, when the conventional electromagnetic wave shielding materials are used on a wall or a window of a building, TV ghosting may occur at an adjacent area of the building due to the reflection of TV signals. In order to solve this problem, it is desirable to have an electromagnetic wave shielding material which selectively reflects electromagnetic waves having frequencies of 1 to 6 GHz which are used as communication waves, and which does not reflect, but passes electromagnetic waves having frequencies of 0.08 to 0.8 GHz, the frequency range of TV waves Japanese Patent Application No. 19739/1988 discloses such frequency-selective electromagnetic wave shielding materials, that is, a dichroic mirror in which layers having different dielectric constants are layered, a material in which ring-shaped copper foils are evenly dispersed, and an electromagnetic wave shielding material in which a thin film electroconductor using a skin effect is employed. However, the electromagnetic wave shielding materials have insufficient shielding capability, and are not practical. Additionally, the electromagnetic wave shielding materials' compositions are complicated, and are difficult to manufacture.

It is known that a pattern as shown in FIGS. 1A and B, having linear or curved electro conductive segments and a gap between the electroconductive segments in the direction of an electric field E, has the property that it only reflects electromagnetic waves in a resonant region, and passes electromagnetic waves in a nonresonant region.

The selective reflection property against the electromagnetic waves of a specific frequencies which is attributed to the LC resonant pattern as described above, is applied to a subreflector of a two frequency shared antenna equipped with an artificial satellite. In this case, a ring pattern as shown in FIG. 2A, or a Jerusalem cross pattern, as shown in FIG. 2B, is formed on a surface of the subreflector by using metal foil (e.g., Electronic Information Communication Society, Technical Report A, pages 86 to 72, 1986-09).

However, these patterns aim at reflecting electromagnetic waves having a frequency range of 7 to 80 GHz, and are unusable in electromagnetic wave shielding materials aimed at reflecting a communication wave. These patterns also have insufficient shielding capability, because it is difficult to sufficiently shield the communication waves, which have efficient permeabilities.

SUMMARY OF THE INVENTION

The object of the present invention is to solve these conventional problems, and to provide an electroconductive loop pattern which selectively shields communication waves, and has sufficient electromagnetic wave shielding capability, and to provide a frequency-selective electromagnetic wave shielding material using the loop pattern.

The present invention provides an electroconductive loop pattern consisting of a plurality electroconductive loop parts which are spatially allocated, wherein each of the electroconductive loop parts is insulated, and circumference parts of adjacent electroconductive loop parts are as near as possible to each other, thereby achieving the above-described object.

BRIEF DESCRIPTION OF THE DRAWINGS

FIG. 5 is a transparent perspective view showing an example of a plural-layered electroconductive loop pattern of the present invention;

Figure 1A:
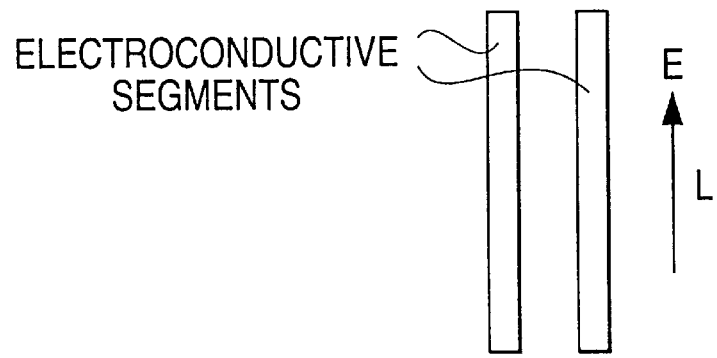
FIGS. 1A and B are upside plane views showing an example of an electroconductive pattern which exhibits LC resonance.
Figure 1B:
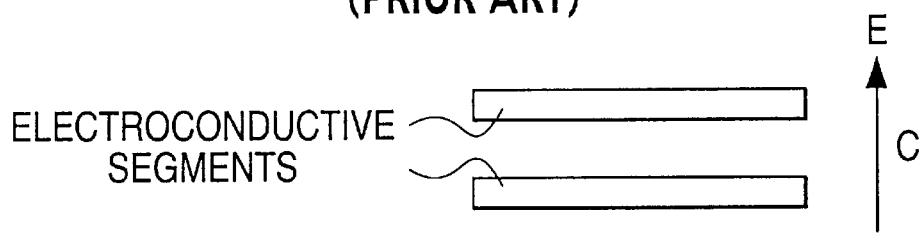

In these figures, the character d represents a distance between circumference parts, and the characters a, a', a", b, b' and b" represent an electroconductive loop part.

EMBODIMENTS OF THE INVENTION

An electroconductive loop pattern of the present invention has a design in which a plurality of electroconductive loop parts are regularly assembled. The loop generally is a closed curve having the same startpoint and endpoint. However, the loop employed in the present invention is any closed shape having the same startpoint and endpoint, and may comprise a curve or an inflected linear line. For example, the loops of the present invention include circles, ellipses, polygons and the like. The polygons referred to include tetragons such as squares, rectangles, hexagons, octagons, and the like. The term polygon also includes those shapes in which the edges are rolled or truncated.

The electroconductive loop is the line part which comprises an electroconductive material. The electroconductive loop part is the whole loop, including the line part comprising the electroconductive material and the inside part surrounded by the line part. The circumference part of the electroconductive loop part is the outside of the line part comprising the electroconductive material.

An electroconductive material includes generally a metal having electroconductive capability, for example, electroconductive metals, electroconductive oxides, electroconductive polymers, and electroconductive composites, and the like. The electroconductive metals includes iron, aluminum, copper, gold, chromium, nickel, silver, tantalum, and the like. The electroconductive oxides include ITO, a tin oxide compound, a zinc oxide compound, and the like. The electroconductive polymers includes polypyrrole, polyaniline, and the like. The electroconductive composites include composites comprising a metal complex such as a silver paste, a copper paste, a nickel paste, TCNQ, and the like. It is preferred for the purpose of the present invention that the surface resistance is less than 200 mΩ. If the electroconductive film has a resistance of more than 200 mΩ, the capability to shield electromagnetic waves becomes poor, and the electromagnetic wave shielding function, which is the purpose of the present invention, may not be achieved. Particularly, preferred materials are aluminum and copper from the viewpoint of cost.

A perimeter of the electroconductive loop part is determined depending on the frequency to be shielded. Generally, the higher the frequency to be shielded, the smaller the perimeter of the electroconductive loop part. The lower the frequency to be shielded, the longer the perimeter of the electroconductive loop part.

The perimeter of the electroconductive loop part is generally not more than 200 mm, and preferably 10 to 100 mm, when electromagnetic waves of low frequency, such as communication waves having frequencies of 1 to 6 GHz (a wavelength of 5 to 30 cm), is shielded.

A width of the circumference part of the electroconductive loop part is determined depending on the desired shielding capability. The width is generally not more than 10 mm and preferably not more than 5 mm. The width may be small, provided that the conductivity of the loop is not less than about 1σ. However, it is preferred that the width is not less than 0.1 mm when conductivity is considered.

A thickness of the electroconductive loop part is not limited, provided that the loop's functions as electroconductor are not harmed. The thickness of the loop is generally 0.001 to 20 μm, preferably 0.005 to 1 μm, and more preferably 0.01 to 0.1 μm. If the thickness of the electroconductive loop is less than 0.001 μm, it becomes difficult to manufacture. If the thickness of the electroconductive loop is more than 20 μm, it becomes difficult to form the loop by etching.

The electroconductive loop parts described above are spatially allocated. The wording "spatially" throughout the description includes both two-dimensional and three-dimensional configurations. For example, an irregular or a regular allocation of the electroconductive loop parts on a two-dimensional plane, and an irregular or a regular allocation of the electroconductive loop parts in three-dimensional space are both considered as being spatially allocated. The electroconductive loop parts are preferably allocated regularly on one plane (substrate) or a plurality of parallel planes (substrates). It is acceptable that the regular allocation is realized when the electroconductive loop parts are observed from a direction vertical to the planes (substrates). That is, when the electroconductive loop parts are formed on plural planes (substrates), accurate regularity is not required for the allocation on an individual plane (substrate). It is sufficient that the regular allocation is realized when the plurality of planes (substrates) are laid together and observed from a direction vertical to the planes (substrates).

In addition, the electroconductive loop parts which are adjacent to each other when observed from the direction vertical to the planes have to be near each other. Thereby, a frequency of the electromagnetic waves to be shielded becomes low. Specifically, the circumference parts of the adjacent electroconductive loop parts have to be as close together as possible. The distance between the circumference parts is determined depending on an objective frequency.

However, the circumference parts of the electroconductive loop parts should not contact each other. That is, each of the electroconductive loop parts has to be isolated electrically. If the electroconductive loop parts are electrically connected, resonance and absorptive properties of the electroconductive loop pattern vary, and the frequency range to be shielded varies.

Figure 3A:
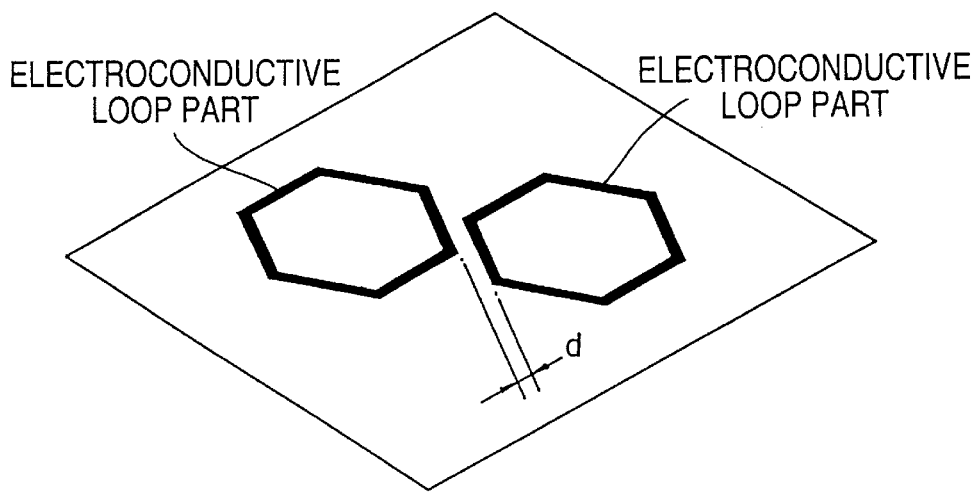
FIGS. 3A and B are perspective views showing examples of a distance between adjacent circumference parts of electroconductive loop parts in electroconductive loop patterns of the present invention.
Figure 3B:
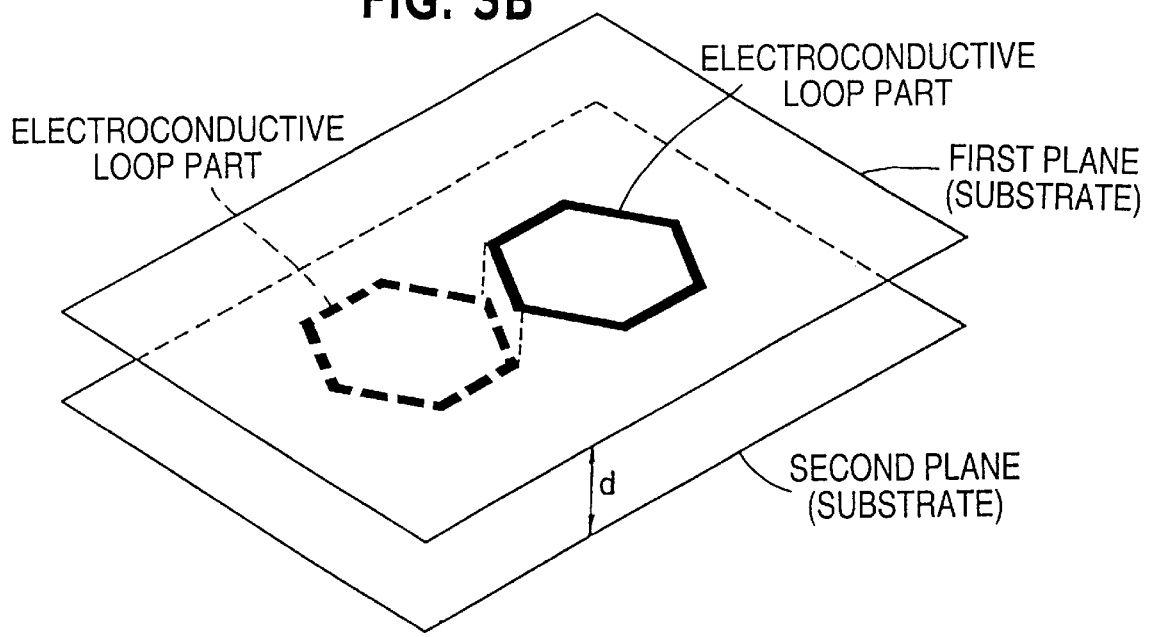

The circumference parts of the electroconductive loop parts may be near each other two-dimensionally as shown in a distance between circumference parts "d" in FIG. 3A, or may be near each other three-dimensionally on different planes as shown in a distance between circumference parts "d" in FIG. 3B.

Figure 4A:
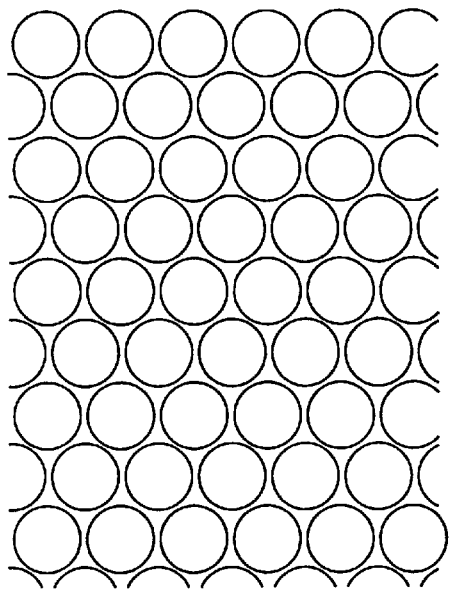
FIGS. 4A, B and C are upside plane views showing examples of electroconductive loop patterns of the present invention.

A style for how the electroconductive loop parts are allocated is not particularly limited. The styles shown in FIGS. 4A to C may be employed for example, and each of the conductive loop parts may be allocated as a near-packed pattern, or a latticed pattern. When the conductive loop parts are square, the allocation of the conductive loop parts as a latticed pattern is the same as the allocation of the conductive loop parts as a near-packed pattern throughout the description.

Generally, the larger the area of the moiety which faces as close together as possible in the circumference parts of the electroconductive loop parts, the lower the frequency of the electromagnetic wave to be shielded. Furthermore, when the electroconductive loop patterns form a linear line when they are observed from the direction vertical to the planes, the longer the linear line, the lower the frequency of the electromagnetic wave to be shielded.

A preferred electroconductive loop pattern is tetragonal, particularly a pattern where square electroconductive loop parts are allocated in a latticed pattern. A tetragonal electroconductive loop pattern shows very strong shielding capability. Therefore, by using this pattern, it becomes possible to sufficiently shield a communication wave which has an efficient permeability.

In one embodiment of the present invention, the individual electroconductive loop parts are allocated on one plane. A distance between the circumferences of the electroconductive loop parts is generally not more than 1 mm, preferably not more than 100 μm, and more preferably not is more than 20 μm. If the distance between the circumferences is more than 1 mm, it becomes difficult to shield electromagnetic waves of a communication wave range.

In another embodiment, the individual electroconductive loop parts are allocated on a plurality of parallel planes. Specifically, a plurality of dielectric films (substrates) (for example, resin films) on which conductive loop parts are applied are laid on top of each other to form an electroconductive pattern comprising a plurality of electroconductive loop parts, regularly allocated, when observed from a direction vertical to the planes.

An advantage of this embodiment is that the distance between the circumferences of the electroconductive loop parts is equal to the thickness of the dielectric film. That is, each of the electroconductive loop parts is electrically insulated by the dielectric film, and that a minute distance between the circumferences of the electroconductive loop parts, which is as thin as the thickness of the film, is achieved.

An additional important advantage of this plural-layered embodiment is that the wavelengths of the electromagnetic waves to be shielded is not effected by the dielectric constant variation of the material which is present around the pattern. For example, with regard to the monolayered embodiment, the wavelength to be shielded shifts when it passes through glass. The degree of shift varies depending on the glass thickness, or dielectric constant variation of the material. Whereas, with regard to the plural-layered embodiment, the wavelength to be selectively shielded does not vary even when it is applied on different materials.

In this case, the distance between the circumferences of the electroconductive loop parts is generally not more than 0.5 mm, and preferably not more than 0.1 mm. Generally, it is difficult to make a resin film of not more than 5 $\mu$m in thickness. However, by using a sequential laminating method in which the electroconductive loop patterns are formed with a lithography method, a resin layer of not more than 5 $\mu$m may be formed between the circumferences of the electroconductive loop parts. A frequency-selective electromagnetic wave shielding material may be prepared by using the above-described electroconductive loop pattern.

In one embodiment of the present invention, a frequency-selective electromagnetic wave shielding material comprises a plurality of electroconductive loop parts regularly allocated on one plane, and a material which supports the loop parts. The material includes a dielectric material having a small dielectric loss, such as a resin film or glass. The electroconductive loop pattern may be formed on the dielectric material with an appropriate method. For example, a method in which the electroconductive loops are printed by using conductive ink, or a method in which a metal film placed on the dielectric material is selectively removed, leaving behind the electroconductive loops, may be used.

A preferred method is that an electroconductive metal film layer is formed over a dielectric material, and then, the metal film is selectively removed with an appropriate method (for example, the lithography method) to form the pattern.

As for the method for forming an electroconductive metal film layer over a dielectric material, any method known to those skilled in the art may be employed. For example, methods in which an electroconductive metal film is laminated, an electroconductive metal film layer is deposited or spattered, or a method of field-less plating are generally included. A preferred method includes the method of depositing (particularly, vacuum depositing) an electroconductive metal film layer, and the method of spattering. The metals which may be employed in these methods are those used for forming, the electroconductive loop parts.

Various resin films having a metal film layer are commercially available, and these may be employed. For example, a polyethylene terphthalate film deposited with aluminum (an aluminum deposited film) is commercially available at low cost and in large quantities, and is preferred from the view point of cost.

Any method known to those skilled in the art may be employed in order to make the metal film layer into a pattern. A preferred method includes the lithography method.

The lithography method generally comprises forming an etching resist on the metal film layer with a conventional printing method, such as gravure printing, surface printing, or screen printing, and then, the metal not covered by the etching resist is eluted with an etching liquid to form a pattern. As a result, a fine metal pattern which has a distance between the circumferences of the electroconductive loop parts of not more than 100 $\mu$m is formed. A photolithography method using photo printing is preferably employed.

In the lithography method using an aluminum deposited film of the present invention, the metal to be etched is soluble into a developer. Therefore, metal etching may be simultaneously conducted when an alkaline developable resist is employed, and as a result, a pattern is easily formed. The resist film may be thin because the deposited film is very thin, and the process is economically advantageous. In addition, high-speed continuous production by roll to roll processing becomes possible.

In another embodiment of the present invention, a frequency-selective electromagnetic wave shielding material comprises a plurality of electroconductive loop parts regularly allocated on plural parallel planes, and material which supports the loop parts. A dielectric material such as a resin film or a resin composition is employed as the material which supports the electroconductive loop parts.

The preferred embodiment of the frequency-selective electromagnetic wave shielding material, as shown in FIG. 5, consists of a plurality of electroconductive loop parts regularly allocated on two parallel planes which are as close together as possible, and the electroconductive loop parts are allocated as a latticed pattern when observed from a direction vertical to the planes.

Figure 6:
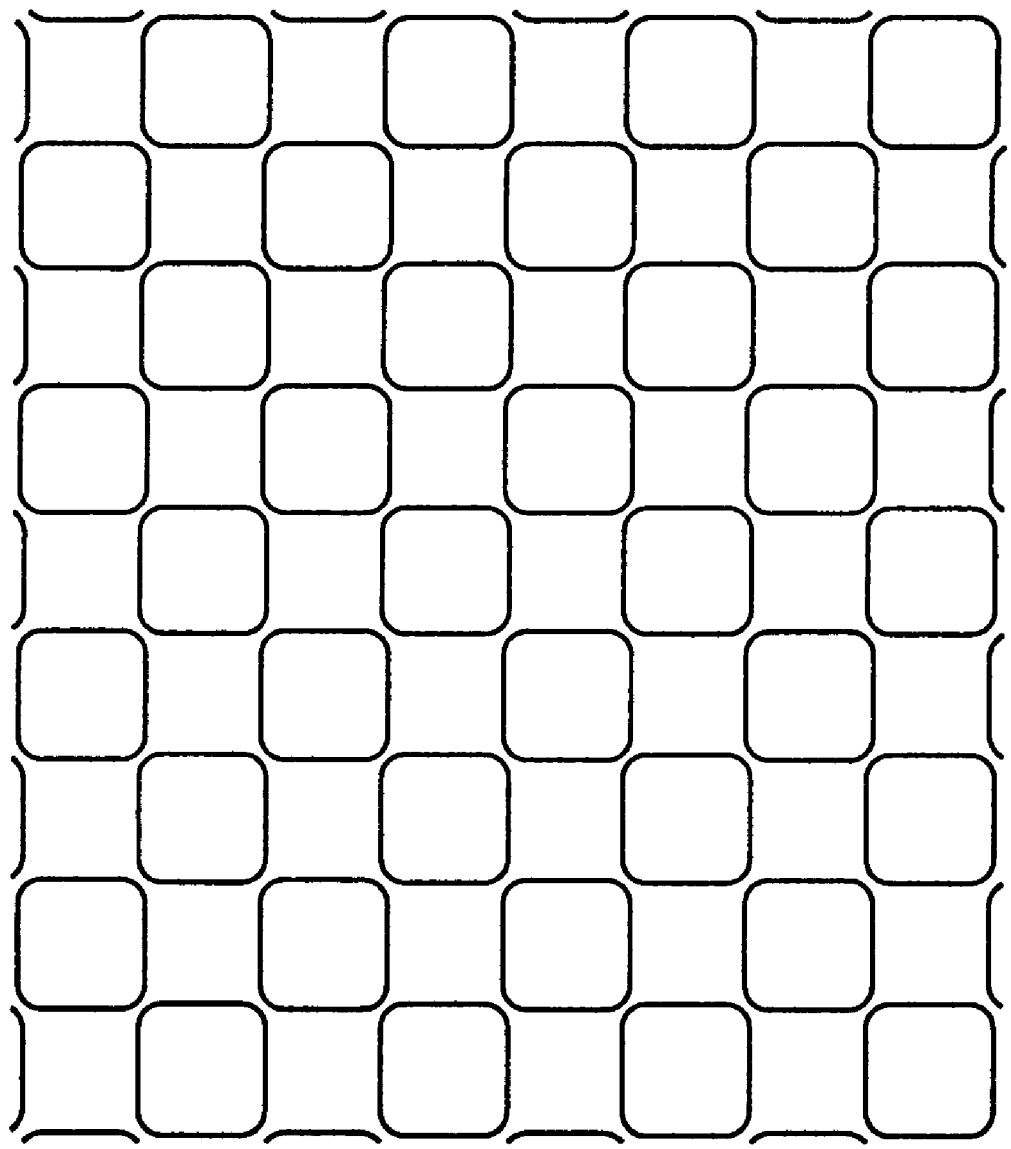
FIG. 6 is an upside plane view showing an example of allocation of electroconductive loop parts for making up an electroconductive loop pattern of the present invention.

The frequency-selective electromagnetic wave shielding material comprises a plurality of same sized electroconductive loop parts a, a', a", etc., which are formed on a first plane and allocated in a manner such that each of the electroconductive loop parts is staggered at a predetermined equal distance, and a plurality of same sized electroconductive loop parts b, b', b", etc., which are formed on a second plane and allocated in a manner such that each of the electroconductive loop parts is staggered in the same fashion as the first plane and the circumference parts of the electroconductive loop parts b, b', b", etc., are as close together as possible with the circumference parts of the electroconductive loop parts a, a', a", etc. FIG. 6 is an upside plane view showing the allocation style of the electroconductive loop parts a, a', a", etc., or the electroconductive loop parts b, b', b", etc.

Such a plural-layered type frequency-selective electromagnetic wave shielding material is prepared by using the process in which the first dielectric film, which has electroconductive loop parts a, a', a", etc., and the second dielectric film, which has electroconductive loop parts b, b', b", etc., are prepared as described above, and then, the first dielectric film and the second dielectric film are laid so that the circumference parts of the electroconductive loop parts a, a', a", etc., and the circumference parts of the electroconductive loop parts b, b', b", etc., become as near to each other as possible. This plural-layered type frequency-selective electromagnetic wave shielding material shows excellent frequency-selective electromagnetic wave shielding capability.

The frequency-selective electromagnetic wave shielding material in which the electroconductive loop parts are square, particularly the plural-layered type frequency-selective electromagnetic wave shielding material of which the electroconductive loop parts are square, shows a very powerful shielding capability. Therefore, by applying this wave shielding material to a building, room, or the like, the building or room may be shielded from communication waves which have efficient permeabilities.

The electromagnetic wave shielding materials conventionally employed generally consist of a metal net, a metal foil, a metal deposited article, a perspective electroconductive film such as ITO used for a perspective item such as a window, or the like. When such a shielding material is provided on a wall, gaps between pieces of the shielding material have to be completely closed. This is because the shielding capability becomes extremely poor when there are gaps greater than a wavelength of an electromagnetic wave. In addition, each of the pieces of the electromagnetic shielding material has to be electrically connected.

For example, when the electromagnetic wave shielding material is applied to a wall, edge parts of pieces of the electromagnetic wave shielding materials having a net form and are wrapped and connected, and are coated with an electroconductive material. Further, when the electromagnetic wave shielding material is applied to a window, shield glass which has previously been conductivated by using ITO or the like is used, and it is assembled with a special frame having a connecting terminal. Thereafter, the shield glass is electrically connected with the adjacent electromagnetic wave shielding materials. Such a shielding process requires a lot of labor and cost.

The electroconductive loop pattern of the present invention is designed such that a plurality of electroconductive loop parts are regularly assembled. The electroconductive parts are not connected electronically to each other. Such a pattern shows LC resonance against electromagnetic waves having a specific range of frequencies that are determined by a shape of the electroconductive parts, a relative location of the electroconductive parts, a material constituting the electroconductive parts, and an electric condition of the space in which the electroconductive parts are located. As a result, it selectively shields only specific electromagnetic waves, and passes other electromagnetic waves.

One aspect of the present invention is that a dielectric film having an electroconductive pattern which shows resonance against the electromagnetic waves having a specific range of frequencies, is found to be a frequency-selective electromagnetic wave shielding material having a high shielding capability. Furthermore, pieces of the wave shielding material do not have to be electrically connected, which is different from the conventional shielding material.

The frequency-selective electromagnetic wave shielding material of the present invention may be used alone, or with a substrate such as glass on which the shielding material is applied by using an adhesive. When a layer of adhesive and a releasing layer are formed on the frequency-selective electromagnetic wave shielding material beforehand, the releasing layer may be removed and the adhesive may be applied when the shielding material is to be used. Various film products may be laminated with the material in order to supply durability, decoration, protection, and the like and a plurality of frequency-selective electromagnetic wave shielding materials may be layered.

EXAMPLES

The present invention is concretely explained by the following examples. It should not be construed that the present invention is limited by these examples.

Example 1

On an aluminum deposited PET film made by Biike Kogyo (deposited film thickness of 500 angstrom, PET thickness of 100 $\mu$m), a positive type liquid resist made by Nippon Paint "OPT ER P-600" was coated to become a dry film having a thickness of 0.5 $\mu$m, after which the film was dried in a hot air oven.

Figure 4C:
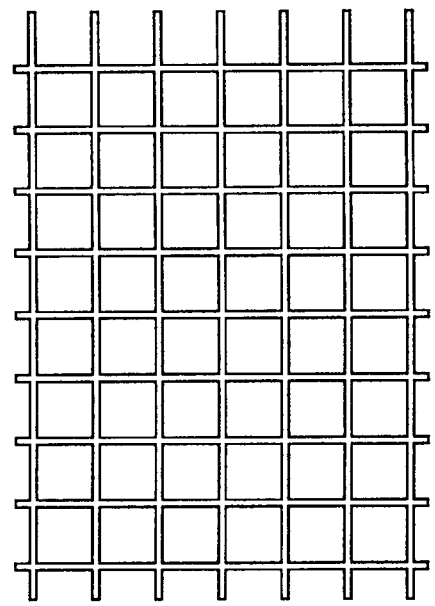
Figure 4B:
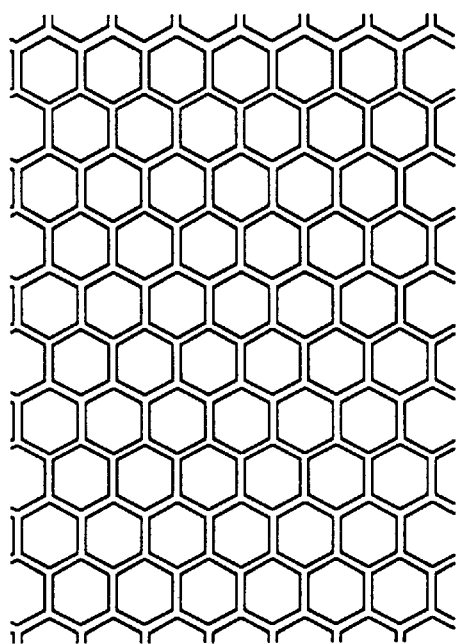

A pattern mask was laid on the resist film, which was exposed to a light having an intensity of 30 mJ/cm$^2$. The exposed resist film was developed with a 1% aqueous solution of caustic soda (sodium hydroxide), and at the same time, the exposed deposited aluminum film was etched to obtain an aluminum deposited pattern film. The obtained electroconductive loop pattern in which square electroconductive loop parts having a side length of 25 mm, a perimeter of 100 mm, and a circumference part width of 1.5 mm are arranged at a distance of 0.3 mm between the circumferences in the style as shown in FIG. 4C.

Performance of the resulting electromagnetic wave shielding material was evaluated according to the following procedure.

Method for Evaluating Shielding Capability

Figure 7:
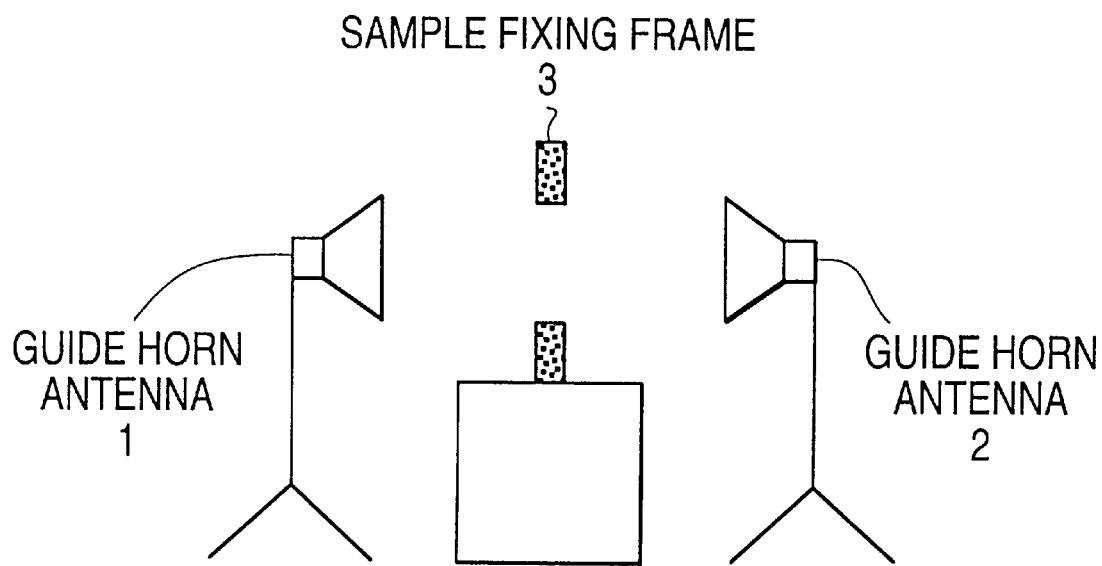
FIG. 7 is an illustrative view showing a configuration of apparatuses for evaluating shielding capability.

As shown in FIG. 7, a pair of guide horn antennas 1, 2 were located in an opposed manner, a network analyzer ("8510B" manufactured by HP Co.) (not shown) was connected to the antennas, and a sample fixing frame 3 made of copper was located between the antennas.

The sample fixing frame was a copper plate of 60×60 cm having a rectangular opening of 20×25 cm.

The S parameter (S21) of direct transmission wave between the antennas at frequencies of 1.9 GHz, and 0.1 GHz was measured by the 'free space time domain' method, and this was set to a transmissive attenuation of 0 dB. An electromagnetic wave shielding material (not shown) was attached to the sample fixing frame 3, and S21 was measured to obtain the transmissive attenuation (shielding capability).

Method for Measuring Shield Gap Latitude

Figure 8:
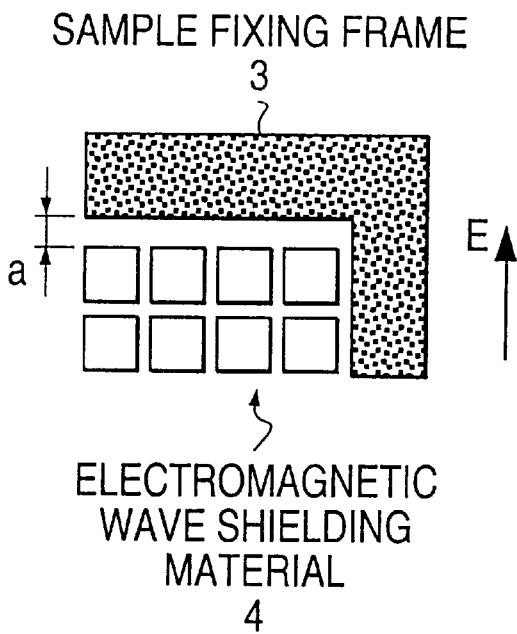
FIG. 8 is an illustrative view showing a configuration of an electromagnetic wave shielding material for evaluating gap latitude.
Figure 9:
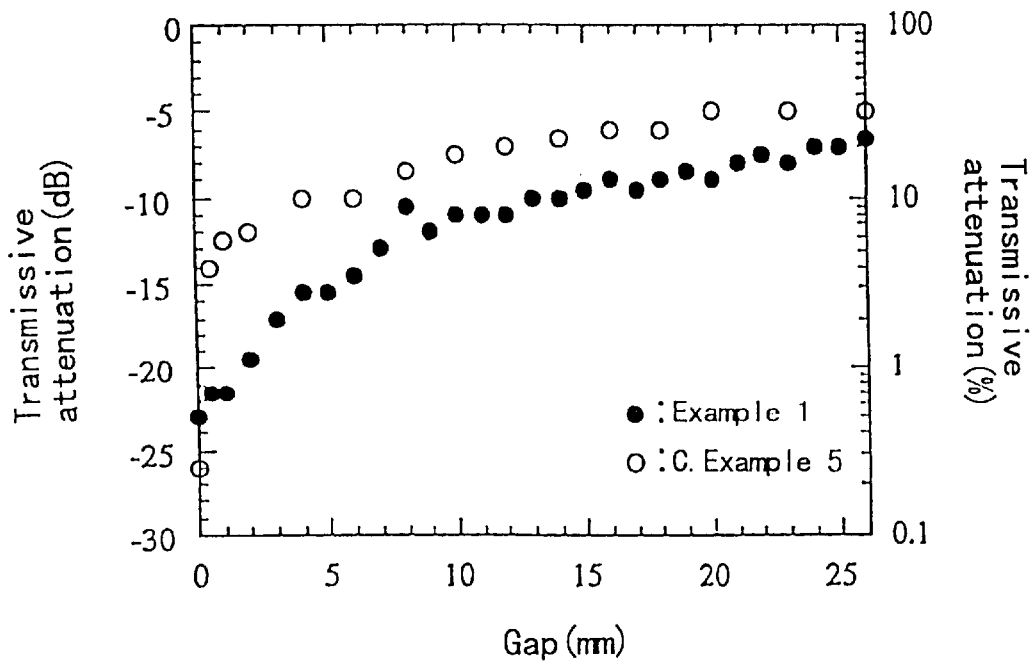
FIG. 9 is a plot of transmittance (dB or %) versus gap (mm)

As shown in FIG. 8, an electromagnetic wave shielding material 4 was attached over the opening of the sample fixing frame 3 with a gap "a" from the top of the fixing frame 4 (In the figure, "E" represents the electric field direction). The gap "a" is gradually extended, and the S21 value was measured by the above-described procedure. The plot of transmittance (dB or %) versus gap "a" (mm) is shown in FIG. 9.

When the S21 value became −15 dB, the value of the gap "a" was adopted as the limit of gap latitude.

Example 2

An electroconductive loop pattern in which the square electroconductive loop parts have a side length of 20 mm, a perimeter of 80 mm, and a circumference part width of 0.5 mm are arranged at a distance of 0.1 mm between the circumferences in the style as shown in FIG. 6, was formed on two aluminum deposited films, respectively, in the same manner as described in Example 1, except that a mask having a different pattern was used.

The two aluminum deposited films were laid in the manner such that the arrangement of the electroconductive pattern satisfies the relationship shown in FIG. 5. In the arrangement, each of the electroconductive loop parts formed on the second film is laid onto a square opening of the first film having four open angles, the square opening being formed by each side of four electroconductive loop parts, through a sheet of film, while being as close together as possible to each other.

One sheet of the film is a polyethylene terephthalate film having a thickness of 100 $\mu$m. Therefore, an electromagnetic wave shielding material on two parallel plains in which a distance between the circumferences of the electroconductive loop patterns is 100 μm, was obtained.

Performance of the resulting electromagnetic shielding material is evaluated in substantially the same manner as described in Example 1. As for the gap latitude, only the limit of gap latitude was measured and the results are shown in Table 1.

The distance between the circumferences was then enlarged to about 10 μm, 20 μm, 60 μm, 105 μm, and 200 μm, by inserting PET films as spacers between the two films comprising the electromagnetic wave shielding material.

For each case, a frequency (a resonant frequency) of the electromagnetic waves in which the electromagnetic wave shielding material shields, was measured according to the same manner as described in the 'Method for Evaluating Shielding Capability'. The plot of resonant frequency versus distance between the circumferences is shown in FIG. 10.

Figure 10:
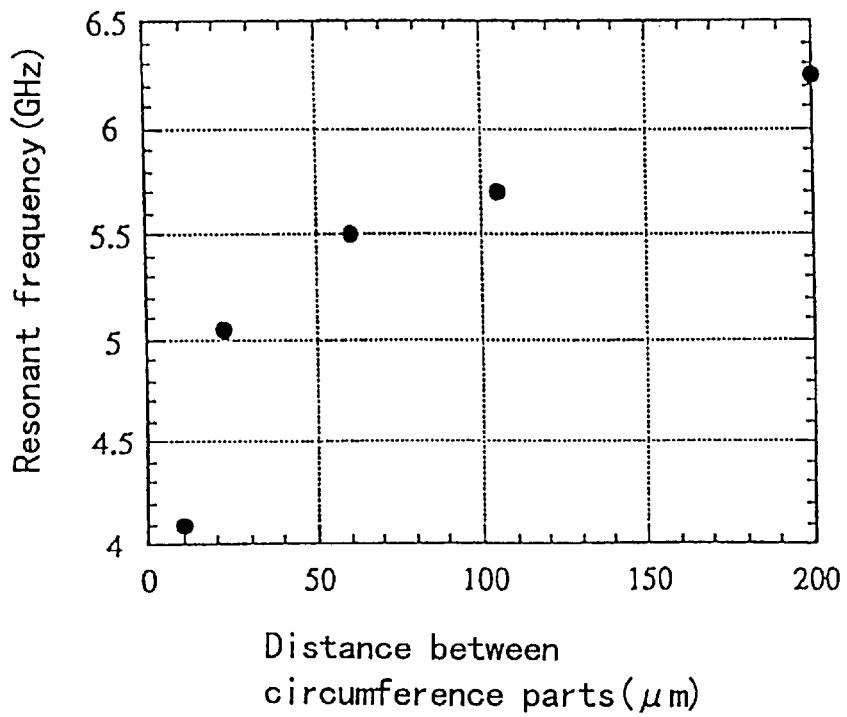
FIG. 10 is a plot of resonant frequency (GHz) versus distance between circumference parts ($\mu$m).

The results of FIG. 10 show that the closer the circumferences of the electroconductive loop parts, the lower the frequency (a resonant frequency) of the electromagnetic waves which the electromagnetic wave shielding material shields.

Example 3

The resonant frequency of the electromagnetic wave shielding material was measured in the same manner as described in the 'Method for Evaluating Shielding Capability' by the electromagnetic wave shielding material obtained in Examples 1 and 2 alone, and in a state in which the shielding material was applied on commercially available glass plates (dielectric constant of 7) having thicknesses of 2 mm, 3 mm, and 5 mm. The results are shown in Table 2.

Comparative Example 1

Figure 2A:
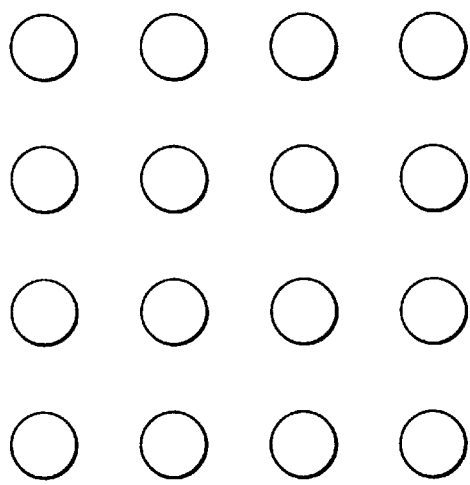
FIGS. 2A and B are upside plane views showing examples of electroconductive patterns which exhibit LC resonance.

An electromagnetic wave shielding material, comprising the electroconductive loop pattern in which circular electroconductive loop parts having a perimeter of 40 mm, and a circumference part width of 2 mm are arranged at a distance of 20 mm between the circumferences in the style as shown in FIG. 2A. The electromagnetic wave shielding material was prepared in the same manner as described in Example 1, except that a mask having a different pattern was used.

Performance of the resulting electromagnetic wave shielding material was evaluated in the same manner as described in Example 1. As for the gap latitude, only the limit of gap latitude was measured. The results are shown in Table 3.

Comparative Example 2

Figure 2B:
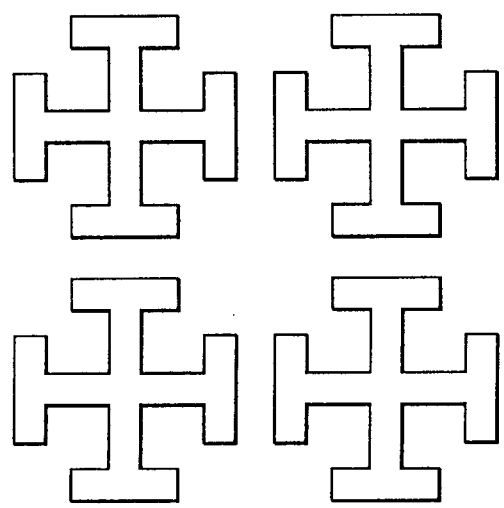

An electromagnetic wave shielding material, comprising the electroconductive loop pattern in which crosses form electroconductive loop parts, each having a length and width of 40 mm, and a line width of 5 mm. The crosses are arranged at a distance of 0.5 mm between circumference lines in the style as shown in FIG. 2B. The electromagnetic wave shielding material was prepared in the same manner as described in Example 1, except that a mask having a different pattern was used.

Performance of the resulting electromagnetic wave shielding material was evaluated in the same manner as described in Example 1. As for the gap latitude, only the limit of gap latitude was measured. The results are shown in Table 3.

Comparative Example 3

An ITO film for shielding electromagnetic wave manufactured by Biike Kogyo Co. (deposited film thickness of 500 angstrom) was used as an electromagnetic wave shielding material. Performance of the electromagnetic wave shielding material was evaluated in the same manner as described in Example 1. As for the gap latitude, only the limit of gap latitude was measured. The results are shown in Table 3.

Comparative Example 4

An ITO film for shielding electromagnetic wave manufactured by Asahi Glass Co. (deposited film thickness of 1500 angstrom) was used as an electromagnetic wave shielding material. Performance of the electromagnetic wave shielding material was evaluated in the same manner as described in Example 1. As for the gap latitude, only the limit of gap latitude was measured. The results are shown in Table 3.

Comparative Example 5

An aluminum plate having a thickness of 1 mm was used as an electromagnetic wave shielding material. Performance of the electromagnetic wave shielding material was evaluated in the same manner as described in Example 1. The results are shown in Table 2. The plot of transmittance (dB or %) versus gap "a" (mm) is shown in FIG. 9.

The results of FIG. 9 show that the frequency-selective electromagnetic wave shielding material of the present invention has excellent gap latitude in comparison with the conventional electromagnetic wave shielding materials.

Method for Evaluating Perspective Visuality

Films obtained in Examples 1 and 2, and Comparative Examples 1 to 5 were applied to transparent window glass. The ease in which the opposite materials were observed through the window glass was evaluated based on the following evaluation standard as the perspective visuality.

Evaluation Standard

5 . . . do not detect that a shield film is applied to the window glass;

4 . . . opening rate is not less than 90%, the opposite matter is easily observable, and the patterned figures are not offensive to the eye;

3 . . . opening rate is not less than 75%, the opposed matter is observable, and the patterned figures are offensive to the eye;

2 . . . opening rate is not less than 74%, the opposed matter is difficult to observe, and the patterned figures are offensive to the eye;

1 . . . visible light transmittance is 0%.

TABLE 1

| | Examples | |
|---|---|---|
| | 1 | 2 |
| Transmissive attenuation | −23 dB | −23 dB |
| (Measured frequency) | (1.9 GHZ) | (1.9 GHZ) |
| Transmissive attenuation | −0.1 dB | −0.1 dB |
| (Measured frequency) | (0.1 GHZ) | (0.1 GHZ) |
| Limit of gap latitude | 5 mm | 5 mm |
| Perspective visuality | 3 | 4 |

TABLE 2

| Glass thickness (mm) | Resonant frequency (GHZ) | |
|---|---|---|
| | Example 1 (Monolayered) | Example 2 (Bilayered) |
| 0 | 1.9 | 1.9 |
| 2 | 1.4 | 1.9 |
| 3 | 1.3 | 1.9 |
| 5 | 1.2 | 1.9 |

TABLE 3

| | Comparative Examples | | | | |
|---|---|---|---|---|---|
| | 1 | 2 | 3 | 4 | 5 |
| Transmissive attenuation (Measured frequency) | −23 dB (1.9 GHZ) | −23 dB (1.9 GHZ) | −7 dB (1.9 GHZ) | −25 dB (1.9 GHZ) | −30 dB (1.9 GHZ) |
| Transmissive attenuation (Measured frequency) | −0.1 db (0.1 GHZ) | −0.1 db (0.1 GHZ) | −7 db (0.1 GHZ) | −25 db (0.1 GHZ) | −30 db (0.1 GHZ) |
| Limit of gap latitude | 5 mm | 5 mm | — | 0.5 mm | 0.5 mm |
| Perspective visuality | 2 | 2 | 5 | 5 | 1 |

Technical Effect of Invention

By using the frequency selective electromagnetic wave shielding material of the present invention, the influence of a gap at a joint between two pieces of electromagnetic wave shielding materials becomes small. The electromagnetic wave shielding materials do not have to be connected each other. Therefore, an electromagnetic wave shielded space may be constructed very conveniently and easily by using the frequency selective electromagnetic wave shielding material of the present invention.

For example, a sheet of the film having the electroconductive pattern of the present invention may be laminated onto a wall decorating material such as a wallcovering, and by using this material, a wall can be shielded. Also, a window may be more easily shielded. A window film comprising a film having the electroconductive pattern of the present invention and an adhesive layer can be applied to normal window glass. The window film may simultaneously have the added abilities provided by a conventional functional film such as shatterproofing, heat ray shielding, UV shielding, antireflecting, antifogging, and the like.

The electroconductive loop pattern of the present invention is not offensive to the eye and is excellent in perspective visuality. Therefore, it is preferable for use in a shielding material for a window. A communication wave may be resonated by more loops that are small in diameter with the condition that the distance between the circumferences of the electroconductive loop parts is made closer. If the diameter of the electroconductive loop parts is made smaller, the electroconductive loop pattern becomes friendlier to the eye, and, thereby, the electromagnetic shielding of a window provides excellent perspective visuality.

A frequency of the electromagnetic waves to be shielded may be freely controlled by the electromagnetic wave shielding material of the present invention. Therefore, for example, when the electromagnetic wave shielding material of the present invention is applied on a window of a tall tower building for shielding PHS waves, TV waves can pass through the shielding material, and therefore, a factor leading to TV ghosting is inhibited. Also, by applying the electromagnetic wave shielding material, a physical microcell is constructed and it becomes possible to increase a telephone circuit density of PHS. On the other hand, when plural radio LAN systems are present in one building, each of which belongs to a different small office and interfere with each other, it becomes possible to utilize the individual radio LAN systems without interrupting a call of radio-mobile phone which has become an essential business tool, by providing a radio LAN frequency shield in the building.

What is claimed is:

1. A frequency-selective electromagnetic wave shielding material, comprising:
    a substrate;
    a plurality of adjacent electroconductive loop parts being spatially allocated on said substrate; and
    each of said plurality of adjacent electroconductive loop parts being insulated from all others of said plurality of adjacent electroconductive loop parts.

2. A frequency-selective electromagnetic wave shielding material claimed in claim 1, wherein said substrate comprises a polyethylene terephthalate film.

3. A frequency-selective electromagnetic wave shielding material claimed in claim 1, wherein said plurality of adjacent electromagnetic loop parts are one of circles, ellipses and polygons.

4. A frequency-selective electromagnetic wave shielding material claimed in claim 1, wherein said plurality of adjacent electromagnetic loop parts comprise one of electroconductive metals, electroconductive oxides, electroconductive polymers and electroconductive composites.

5. A frequency-selective electromagnetic wave shielding material claimed in claim 1, wherein said plurality of adjacent electroconductive loop parts are not separated by a distance of more than 20 $\mu$m.

6. A frequency-selective electromagnetic wave shielding material claimed in claim 1, wherein said plurality of adjacent electroconductive loop parts are not separated by a distance of more than 1 mm.

7. A frequency-selective electromagnetic wave shielding material claimed in claim 1, wherein said plurality of adjacent electroconductive loop parts are allocated in a lattice pattern.

8. A frequency-selective electromagnetic wave shielding material claimed in claim 1, wherein a distance between said plurality of adjacent electroconductive loop parts determines a frequency to be shielded.

9. A frequency-selective electromagnetic wave shielding material, comprising:
    first and second substrates;
    a plurality of adjacent electroconductive loop parts being spaced at a predetermined distance and allocated on said first substrate;
    a plurality of adjacent electroconductive loop parts being spaced at said predetermined distance and allocated on said second substrate;
    each of said plurality of adjacent electroconductive loop parts being insulated from all others of said plurality of adjacent electroconductive loop parts; and
    said first substrate being placed adjacent to said second substrate such that said plurality of electroconductive loop parts allocated on said first substrate and said plurality of electroconductive loop parts allocated on said second substrate appear to form an overlapping pattern when observed from a direction perpendicular to said first and second substrates.

10. A frequency-selective electromagnetic wave shielding material claimed in claim 9, wherein said first and second substrates each comprise a polyethylene terephthalate film.

11. A frequency-selective electromagnetic wave shielding material claimed in claim 9, wherein said plurality of adjacent electromagnetic loop parts allocated on said first and second substrates are one of circles, ellipses and polygons.

12. A frequency-selective electromagnetic wave shielding material claimed in claim 9, wherein said plurality of adjacent electromagnetic loop parts allocated on said first and second substrates comprise one of electroconductive metals, electroconductive oxides, electroconductive polymers and electroconductive composites.

13. A frequency-selective electromagnetic wave shielding material claimed in claim 9, wherein said plurality of adjacent electroconductive loop parts allocated on said first and second substrates, respectively, are not separated by a distance of more than 5 µm.

14. A frequency-selective electromagnetic wave shielding material claimed in claim 1, wherein said plurality of adjacent electroconductive loop parts allocated on said first and second substrates, respectively, are not separated by a distance of more than 0.5 mm.

15. A method for frequency-selective electromagnetic wave shielding, comprising:
applying to at least one of a wall or window, a frequency-selective electromagnetic wave shielding material comprising a substrate, a plurality of adjacent electroconductive loop parts being spatially allocated on said substrate, and each of said plurality of adjacent electroconductive loop parts being insulated from all others of said plurality of adjacent electroconductive loop parts.

16. A method for frequency-selective electromagnetic wave shielding claimed in claim 15, wherein said substrate comprises a polyethylene terephthalate film.

17. A method of frequency-selective electromagnetic wave shielding claimed in claim 15, wherein said plurality of adjacent electromagnetic loop parts are one of circles, ellipses and polygons.

18. A method of frequency-selective electromagnetic wave shielding material claimed in claim 15, wherein said plurality of adjacent electromagnetic loop parts comprise one of electroconductive metals, electroconductive oxides, electroconductive polymers and electroconductive composites.

19. A method of frequency-selective electromagnetic wave shielding material claimed in claim 15, wherein said plurality of adjacent electroconductive loop parts are not separated by a distance of more than 20 µm.

20. A method of frequency-selective electromagnetic wave shielding material claimed in claim 15, wherein said plurality of adjacent electroconductive loop parts are not separated by a distance of more than 1 mm.

21. A method of frequency-selective electromagnetic wave shielding material claimed in claim 15, wherein said plurality of adjacent electroconductive loop parts are allocated in a lattice pattern.

* * * * *